United States Patent
Hey

(10) Patent No.: US 10,330,765 B2
(45) Date of Patent: Jun. 25, 2019

(54) METAL ARTIFACT CORRECTION IN MAGNETIC RESONANCE IMAGING

(71) Applicant: KONINKLIJKE PHILIPS N.V., Eindhoven (NL)

(72) Inventor: Silke Hey, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 45 days.

(21) Appl. No.: 15/547,097

(22) PCT Filed: Jan. 29, 2016

(86) PCT No.: PCT/EP2016/051858
§ 371 (c)(1),
(2) Date: Jul. 28, 2017

(87) PCT Pub. No.: WO2016/124483
PCT Pub. Date: Aug. 11, 2016

(65) Prior Publication Data
US 2018/0017651 A1 Jan. 18, 2018

(30) Foreign Application Priority Data
Feb. 2, 2015 (EP) .................................. 15153420

(51) Int. Cl.
*G01R 33/565* (2006.01)
*G01R 33/483* (2006.01)
*G01R 33/561* (2006.01)

(52) U.S. Cl.
CPC ... *G01R 33/56536* (2013.01); *G01R 33/4835* (2013.01); *G01R 33/561* (2013.01)

(58) Field of Classification Search
CPC .......... G01R 33/56536; G01R 33/4835; G01R 33/561
See application file for complete search history.

(56) References Cited

U.S. PATENT DOCUMENTS

| 7,928,729 B2 | 4/2011 | Hargreaves et al. |
| 2014/0002080 A1* | 1/2014 | Den Harder ......... G01R 33/445 324/309 |

(Continued)

OTHER PUBLICATIONS

Lu et al "Towards Artifact-Free MRI Near Metallic Implants" Proc. Intl. Soc. Mag. Reson. Med 16 (2008) p. 838.

(Continued)

*Primary Examiner* — G. M. A Hyder

(57) ABSTRACT

The invention provides for a magnetic resonance imaging system. Instructions cause a processor (136) controlling the magnetic resonance imaging system to modify (200) pulse sequence data by omitting at least some of the phase encodings (408) that encode for volumes outside of the field of view. The pulse sequence data specifies the acquisition of a stack (128) of two dimensional slices of a field of view (126). The pulse sequence data further specifies phase encoding in a direction (130) perpendicular to the two dimensional slices. The pulse sequence data specifies a maximum SEMAC factor (400). The maximum SEMAC factor specifies a maximum number of phase encoding steps in the perpendicular direction for each of the two dimensional slices. The instructions further cause the processor to determine (202) a slice SEMAC factor for each of the stack of two dimensional slices. The slice SEMAC factor is determined by counting the phase encoding steps that encode for regions within the field of view. The instructions further cause the processor to modify (204) the pulse sequence data by dividing the stack of two dimensional slices into multiple packages (502, 504). Slices within each of the multiple packages are ordered using an outer linear profile in the perpendicular direction. The stack of two dimensional slices are divided into the multiple packages by grouping slices which have a slice SEMAC factor within a predetermined range. Each of the multiple packages is (Continued)

acquired as a series of pulse sequence repetitions. The instructions further cause the processor to modify (206) the pulse sequence data by reordering the profile order of a package to remove at least some of the phase encodings outside of the field of view.

14 Claims, 7 Drawing Sheets

(56) References Cited

U.S. PATENT DOCUMENTS

2014/0043023 A1    2/2014   Reeder et al.
2015/0309139 A1*  10/2015   Bachschmidt ....... G01R 33/341
                                                        324/309
2015/0362576 A1   12/2015   Jurrissen et al.

OTHER PUBLICATIONS

Lu et al "SEMAC: Slice Encoding for Metal Artifact Correction in MRI" Magnetic Resonance in Medicine, vol. 62, 2009 p. 66-76.
Den Harder, J.M.: "Metal Implant Artifact Reduction in Magnetic Resonance Imaging", Online 2014,XP002742062,Retrieved from the Internet:URL:http://alexandria.tue.nl/extra2/783940.pdf [retrieved on Jul. 9, 2015].
Hargreaves B.A. et al.: "Accelerated Slice-Encoding for Metal Artifact Correction", Proceedings of the International Society for Magnetic Resonance in Medicine, 17th Scientific Meeting & Exhibition,Apr. 18, 2009 (Apr. 18, 2009), p. 258.
Lu et al "Compressive Slice Encoding for Metal Artifact Correction" Proc. Intl. Soc. Mag. Reson. Med 18 (2010) p. 3079.
Sutter et al "Reduction of Metal Artifacts in Patients With Total Hip Arthroplasty With Slice.." Radiology vol. 265, No. 1 Oct. 2012.
Hargreaves B.A. et al.: "Adaptive Slice Encoding for Metal Artifact Correction", Proceedings of the International Society for Magnetic Resonance in Medicine, 18 (2010) p. 3083.

* cited by examiner

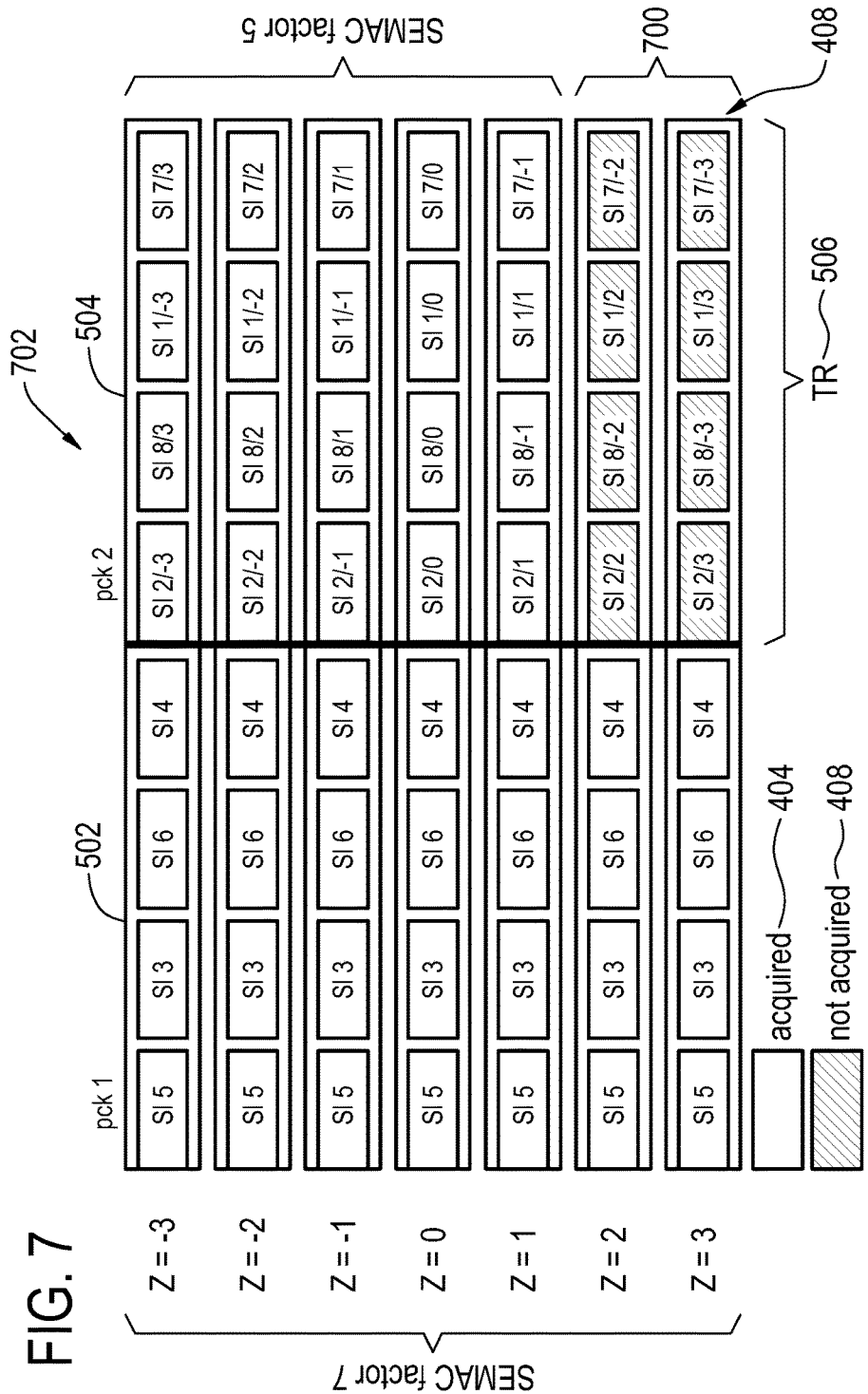

METAL ARTIFACT CORRECTION IN MAGNETIC RESONANCE IMAGING

CROSS REFERENCE TO RELATED APPLICATIONS

This application is a U.S. national phase application of International Application No. PCT/EP2016/051858, filed on Jan. 29, 2016, which claims the benefit of EP Application Serial No. 15153420.3 filed on Feb. 2, 2015 and is incorporated herein by reference.

TECHNICAL FIELD OF THE INVENTION

The invention relates to magnetic resonance imaging, in particular to the correction of artifacts in magnetic resonance images caused by the presence of metallic objects.

BACKGROUND OF THE INVENTION

A static magnetic field is used by Magnetic Resonance Imaging (MRI) scanners to align the nuclear spins of atoms as part of the procedure for producing images within the body of a patient. This static magnetic field is referred to as the $B_0$ field.

The presence of metallic objects within a subject being imaged can however distort the $B_0$ field. This may cause artifacts within acquired magnetic resonance images.

In Lu et. al., "SEMAC: Slice Encoding for Metal Artifact Correction in MRI," Magnetic Resonance in Medicine, volume 62, 2009, pp. 66-76, (hereafter "Lu et. al.") the SEMAC image acquisition technique is explained. The SEMAC technique uses additional phase encoding during the acquisition of the magnetic resonance data to correct for through-plane distortions caused by metallic objects within the subject. The thesis of Chiel den Harder 'Metal implant artifact reduction in magnetic resonance imaging' (2014) mentions that at the edge of the acquired volume not all off-resonance image are acquired.

SUMMARY OF THE INVENTION

The invention provides for a magnetic resonance imaging system, a method, and a computer program product in the independent claims. Embodiments are given in the dependent claims.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins using the antenna of a Magnetic resonance apparatus during a magnetic resonance imaging scan. Magnetic resonance data is an example of medical image data. A Magnetic Resonance Imaging (MRI) image is defined herein as being the reconstructed two or three dimensional visualization of anatomic data contained within the magnetic resonance imaging data. This visualization can be performed using a computer.

In one aspect the invention provides for a magnetic resonance imaging system for acquiring magnetic resonance data from an imaging zone. The magnetic resonance imaging system comprises a memory containing machine-executable instructions and pulse sequence data. Pulse sequence data as used herein encompasses data which is descriptive of the controls necessary for a magnetic resonance imaging system to acquire magnetic resonance data according to a particular protocol. The pulse sequence data could for example be directly in the form of machine commands which enable a processor or other controller to directly control the magnetic resonance imaging system to acquire the magnetic resonance data. The pulse sequence data could also encompass data which is easily transformed into machine-executable instructions. For instance very typically pulse sequences are designed in the form of a timeline. The entries on this timeline could be converted by a program or compiler into instructions which directly are used to control the magnetic resonance imaging system.

The pulse sequence data is descriptive of a SEMAC magnetic resonance imaging method. SEMAC stands for slice encoding for metal artifact correction in magnetic resonance imaging. This technique is for example described in Lu et. al.

The pulse sequence data specifies the acquisition of a stack of two-dimensional slices of a field of view. The field of view is within the imaging zone. The pulse sequence data further specifies phase encoding in a perpendicular direction. The perpendicular direction is perpendicular to the two-dimensional slices. The pulse sequence data specifies a maximum SEMAC factor. The maximum SEMAC factor specifies a maximum number of phase encoding steps in the perpendicular direction for each of the two-dimensional slices. In various examples the maximum SEMAC factor could be varied based upon how large the magnetic field of the magnetic resonance imaging system is distorted. Normally the SEMAC magnetic resonance imaging methods are used when a metal or other object within the subject distorts the $B_0$ magnetic field.

The magnetic resonance imaging system further comprises a processor for controlling the magnetic resonance imaging system. Execution of the machine-executable instructions causes the processor to identify selected phase encodings or a set of phase encodings that encode for volumes outside of the stack of two dimensional slices. Equivalently, one could modify the pulse sequence data by removing phase encodings that encode volumes outside of the field of view. That is to say the phase encodings could also be removed as they are identified, During the SEMAC imaging or acquisition of magnetic resonance data, magnetic resonance data for a particular slice is acquired repeatedly using a number of phase encodings. These phase encodings are perpendicular to the two-dimensional planes and essentially are used to capture data from a slice which is offset from that particular slice.

Slices which are near the edge of the field of view may have phase encoding steps which acquire data from outside of the field of view. As this is outside of the field of view it is not of interest to acquire the data from those phase encoding steps. Therefore during steps where data would have been acquired from outside of the field of view this particular phase encoding step can be skipped. Execution of the machine-executable instructions further cause the processor to determine a slice SEMAC factor for each of the stack of two-dimensional slices. The slice SEMAC factor is determined by counting the phase encoding steps for each of the stack of two-dimensional slices that are within the region of interest (ROI). That is to say that in the previous step a number of phase encodings were identified or omitted. In summary, in some slices particular phase encoding steps are not performed. This decreases the slice SEMAC factor. For example if the SEMAC factor were 5 for a particular slice two phase encoding steps would encode data that are outside of the field of view these two phase encoding steps would not be performed. This would reduce the slice SEMAC factor from 5 down to 3.

Execution of the machine-executable instructions further cause the processor to modify the pulse sequence data by dividing the stack of two-dimensional slices into multiple packages. Slices within each of the multiple packages are ordered using an outer linear profile in the perpendicular direction. The stack of two-dimensional slices are divided into the multiple packages by grouping slices which have a slice SEMAC factor within a predetermined range. Each multiple package is acquired as a series of pulse sequence repetitions. Ordering by the outer linear profile means to group slices with the same phase encoding together.

Execution of the machine-executable instructions further cause the processor to modify the pulse sequence data by reordering the profile order of the package to remove at least some of the selected phase encodings. When a phase encoding step is skipped there is essentially a hole in the particular pulse repetition it was removed from. Simply not performing a particular phase encoding in this case would not reduce the acquisition time because there are empty holes in the pulse sequence repetitions. Making the pulse sequence repetitions shorter may not work, because the same magnetization steady state has to be achieved by all slices in order to have comparable signal weighting for all slices.

To reduce the time the acquisitions which have selected phase encodings are swapped with those at the end of the package or with a chosen pulse repetition within the package. If a particular pulse sequence repetition can be completely filled by reordering the profile order then whole pulse repetition can be skipped. This results in a time saving when applying the SEMAC method for acquiring magnetic resonance data. Execution of the machine-executable instructions further cause the processor to acquire the magnetic resonance data by controlling the magnetic resonance imaging system with the pulse sequence data.

In another embodiment the profile order of the packages are ordered to remove at least some of the selected phase encodings by swapping the selected phase encoding to a chosen pulse sequence repetition. The package is one of the multiple packages. The chosen pulse sequence repetition is one or more of a series of pulse sequence repetitions of the package. In examples described herein the selected phase encodings are swapped to the end of the package. However, the selected phase encodings do not necessarily need to be swapped to the end of the pulse repetitions of the package. As long as a complete pulse repetition is filled with selected phase encodings that entire pulse repetition may be removed from the package and thereby shorten the acquisition time.

In some examples the chosen pulse sequence repetition is an end pulse sequence repetition. After the end of the pulse sequence repetition no further acquisition of the magnetic resonance data occurs during execution of the package.

In another embodiment the selected phase encodings are removed by truncating the package by skipping the chosen pulse sequence repetition if the chosen pulse sequence is filled with at least a portion of the selected phase encodings.

In another embodiment each of the stack of two-dimensional slices has a slice width. Each phase encoding in the perpendicular direction corresponds to an offset that is equivalent to the slice width. This may be beneficial because it enables data from different slices that have been phase encoded to be combined together to create corrected slices.

In another embodiment each of the series of pulse sequence repetitions contains one measurement of the magnetic resonance data from each slice of the package.

In another embodiment the pulse sequence data specifies the acquisition of a stack of two-dimensional slices of a field of view using a view-angle-tilting spin-echo sequence.

In another embodiment execution of the instructions further cause the processor to reconstruct a magnetic resonance image from the magnetic resonance data according to the SEMAC magnetic resonance imaging method.

In another aspect the invention provides for a method of operating a magnetic resonance imaging system for acquiring magnetic resonance data from an imaging zone by controlling the magnetic resonance imaging system with pulse sequence data. The pulse sequence data is descriptive of a SEMAC magnetic resonance imaging method. The pulse sequence data specifies the acquisition of a stack of two-dimensional slices of a field of view. The pulse sequence data further specifies phase encoding in a perpendicular direction. The perpendicular direction is perpendicular to the two-dimensional slices. The pulse sequence data specifies a maximum SEMAC factor. The maximum SEMAC factor specifies a maximum number of phase encoding steps in the perpendicular direction for each of the two-dimensional slices. The method comprises the step of modifying the pulse sequence data by selecting phase encodings that encode for volumes outside of the field of view. The method further comprises the step of determining a slice SEMAC factor for each of the stack of two-dimensional slices. The slice SEMAC factor is determined by counting the remaining phase encoding steps for each of the stack of two-dimensional slices.

The method further comprises the step of modifying the pulse sequence data by dividing the stack of two-dimensional slices into multiple packages. The slices within each of the multiple packages are ordered using an outer linear profile in the perpendicular direction. The stack of two-dimensional slices are divided into the multiple packages by grouping slices which at least have a slice SEMAC factor within a predetermined range. Each of the multiple packages is acquired as a series of pulse sequence repetitions. The division of the pulse sequences such that the stacks divided into multiple packages may also have additional criteria.

For example slices may additionally be interleaved or have more slices in between them. For instance if two slices are acquired next to each other in the same package the encodings in one slice may affect the other one. Very often when selecting slices for the multiple packages the slices adjacent to each other may be placed in different packages. Alternatively to this the order of the slices in a particular pulse repetition within a package may also be changed to help reduce the effect of slices interacting with each other. In a case when they are adjacent slices they may be arranged in the pulse sequence repetition so that the particular slice has a time to relax.

The method further comprises the step of modifying the pulse sequence data by reordering the profile order of a package to remove at least some of the selected phase encodings. The package is chosen from the multiple packages. The method further comprises the step of acquiring magnetic resonance data by controlling the magnetic resonance imaging system with the pulse sequence data.

The stack of two-dimensional slices that have additional profiles (SEMAC) phase-encoded orthogonal to the slices is divided in to several packages. Within each package the SEMAC-factor is in a (preferably narrow) predetermined range. The initial acquisition order of the profiles is that at each SEMAC phase encoding step the profiles of all slices having their SEMAC factor of the package at issue are acquired and then the SEMAC-phase encoding is linearly increased. Thus, in the nested iterations of slices and profiles with SEMAC phase encoding ordering, the outer loop is the linear SEMAC profile (phase encoding) ordering. This is indicated as ordering the slices in the package by the outer linear profile.

In packages with SEMAC-factor less than the maximum SEMAC value, a re-arrangement of SEMAC profile ordering is applied to replace superfluous phase encoding steps by a next required phase encoded profile of a different slice. This allows to move all superfluous SEMAC profiles to the end of the package. Then, in the acquisition of the package, the package can be truncated at the superfluous profiles. In other words, the re-ordering of the profiles within the package forms a continuous succession of required profiles on that package.

In another embodiment the profile order of the package is reordered to remove at least some of the selected phase encodings by swapping the selected phase encodings to a chosen pulse sequence repetition. The package is one of the multiple packages. The chosen pulse sequence repetition is one or more of the series of pulse sequence repetitions of the package.

In another embodiment the selected phase encodings are removed by truncating the package by skipping the chosen pulse sequence repetition if the chosen pulse sequence repetition is filled with at least a portion of the selected phase encodings.

In another embodiment each of the stack of two-dimensional slices has a slice width. Each phase encoding within the perpendicular direction corresponds to an offset that is equivalent to the slice width.

In another embodiment each of the series of pulse sequence repetitions contains one measurement of the magnetic resonance data from each slice of the package.

In another embodiment the method further comprises the step of reconstructing a magnetic resonance image from the magnetic resonance data according to the SEMAC magnetic resonance imaging method.

In another aspect the invention provides for a computer program product comprising machine-executable instructions for execution by a processor controlling a magnetic resonance imaging system. The magnetic resonance imaging system is configured for acquiring magnetic resonance data from an imaging zone. The magnetic resonance imaging system comprises a memory containing pulse sequence data. The pulse sequence data is descriptive of a SEMAC magnetic resonance imaging method. The pulse sequence data specifies the acquisition of a stack of two-dimensional slices of a field of view. The pulse sequence data further specifies phase encoding in a perpendicular direction. The perpendicular direction is perpendicular to the two-dimensional slices. The pulse sequence data specifies a maximum SEMAC factor. The maximum SEMAC factor specifies a maximum number of phase encoding steps in the perpendicular direction for each of the two-dimensional slices.

Execution of the machine-executable instructions causes the processor to identify selected phase encodings in the pulse sequence data that encode for volumes outside of the field of view. Execution of the machine-executable instructions further cause the processor to determine a slice SEMAC factor for each of the stack of two-dimensional slices. The slice SEMAC factor is determined by counting the phase encoding steps for each of the stack of two-dimensional slices that are within the region of interest. Execution of the machine-executable instructions further cause the processor to modify the pulse sequence data by dividing the stack of two-dimensional slices into multiple packages. Slices within each of the multiple packages are ordered using an outer linear profile in the perpendicular direction.

The stack of two-dimensional slices are divided into the multiple packages by grouping slices which have a slice SEMAC factor within a predetermined range. Each of the multiple packages is acquired as a series of pulse sequence repetitions. Execution of the machine-executable instructions further cause the processor to modify the pulse sequence data by reordering the profile order of a package to remove the selected phase encodings. The package is chosen from the multiple packages. Execution of the machine-executable instructions further cause the magnetic resonance imaging system to acquire the magnetic resonance data by controlling the magnetic resonance imaging system with the pulse sequence data.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which:

FIG. 7 further illustrates the modified SEMAC method of magnetic resonance imaging.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
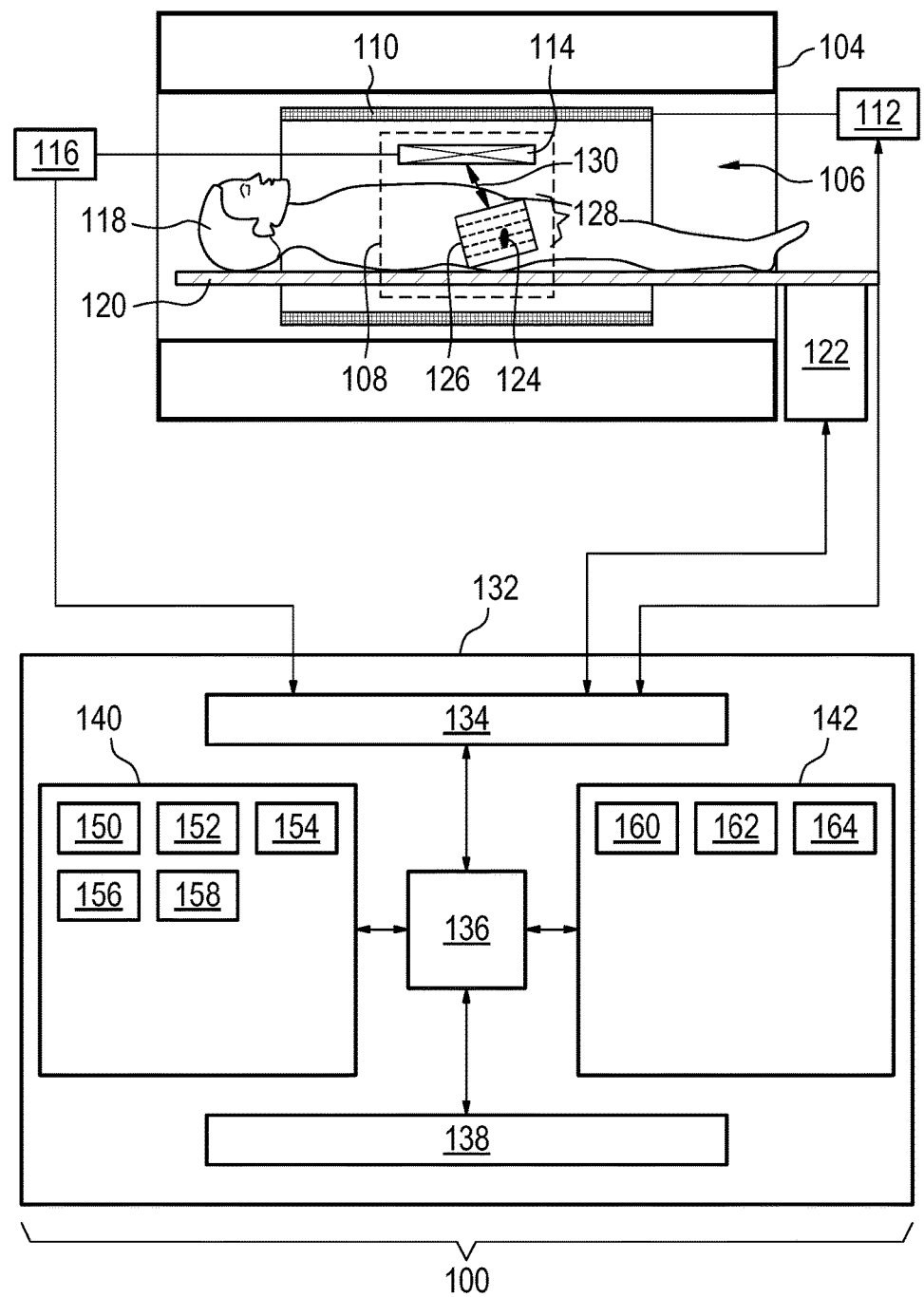
FIG. 1 illustrates an example of a magnetic resonance imaging system.

FIG. 1 shows an example of a magnetic resonance imaging system 100 with a magnet 104. The magnet 104 is a superconducting cylindrical type magnet 104 with a bore 106 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 106 of the cylindrical magnet 104 there is an imaging zone 108 where the magnetic field is strong and uniform enough to perform magnetic resonance imaging.

Within the bore 106 of the magnet there is also a set of magnetic field gradient coils 110 which is used for acquisition of magnetic resonance data to spatially encode magnetic spins within the imaging zone 108 of the magnet 104. The magnetic field gradient coils 110 connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Adjacent to the imaging zone 108 is a radio-frequency coil 114 for manipulating the orientations of magnetic spins within the imaging zone 108 and for receiving radio transmissions from spins also within the imaging zone 108. The radio frequency antenna may contain multiple coil elements. The radio frequency antenna may also be referred to as a channel or antenna. The radio-frequency coil 114 is connected to a radio frequency transceiver 116. The radio-frequency coil 114 and radio frequency transceiver 116 may be replaced by separate transmit and receive coils and a separate transmitter and receiver. It is understood that the radio-frequency coil 114 and the radio frequency transceiver 116 are representative. The radio-frequency coil 114 is intended to also represent a dedicated transmit antenna and a dedicated receive antenna. Likewise the transceiver 116 may also represent a separate transmitter and receivers. The radio-frequency coil 114 may also have multiple receive/transmit elements and the radio frequency transceiver 116 may have multiple receive/transmit channels.

Within the subject 118 there is a metallic object 124. A region of interest 126 has been positioned around the metallic object 124 and within the imaging zone 108. The field of view 126 is divided into a stack of slices 128. The arrow 130 indicates a direction perpendicular to the plane of the stack of slices 128. The phase encoding gradients are applied in the direction 130.

The subject support 120 is attached to an optional actuator 122 that is able to move the subject support and the subject 118 through the imaging zone 108. In this way a larger portion of the subject 118 or the entire subject 118 can be imaged. The transceiver 116, the magnetic field gradient coil power supply 112 and the actuator 122 are all see as being connected to a hardware interface 134 of computer system 132. The computer comprises a computer storage 140, an optional user interface 138 and a computer memory 142. The contents of the computer memory 142 and computer storage 140 may be interchanged or duplicated.

The computer storage 140 is shown as containing pulse sequence data 150. The pulse sequence data 150 contains instructions to enable the processor 136 to acquire magnetic resonance data according to a SEMAC magnetic resonance imaging method. The computer storage 140 is further shown as containing a maximum SEMAC factor 152. This for instance may be predetermined or may be received from the user interface 138. The computer storage 140 further shows slice SEMAC factors 154 for each of the stack of slices 128. The computer storage 154 further shows magnetic resonance data 156 that was acquired with the pulse sequence data 150 controlling the magnetic resonance imaging system 100. The computer storage 140 further shows a magnetic resonance image 158 that was reconstructed from the magnetic resonance data 156.

The computer memory 142 is shown as containing a control module 160. The control module 160 contains computer-executable instructions which enables the processor 136 to control the operation and function of the magnetic resonance imaging system 100 to acquire the magnetic resonance data. The computer memory 142 is further shown as containing a pulse sequence modification module 162. The pulse sequence modification module 162 enables the processor 136 to perform the steps of modifying the pulse sequence data. The computer memory 142 is further shown as containing an image reconstruction module 164 which contains instructions which cause the processor to reconstruct the magnetic resonance image 156 from the magnetic resonance data 154.

Figure 2:
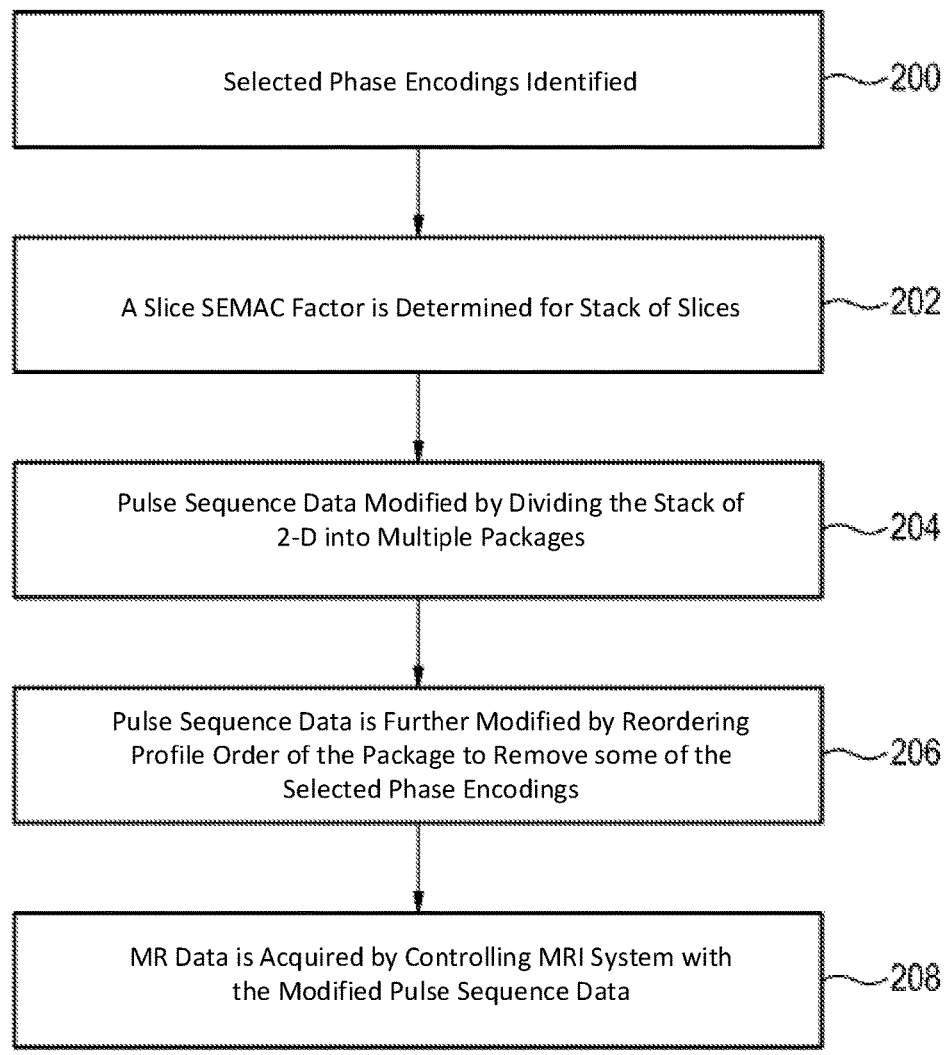
FIG. 2 shows a flow chart that illustrates a method of operating the magnetic resonance imaging system of FIG. 1.

FIG. 2 shows a flowchart which illustrates a method of operating the magnetic resonance imaging system 100 in FIG. 1. First in step 200 selected phase encodings are identified in the pulse sequence data that encode for volumes outside of the field of view. Next in step 202 a slice SEMAC factor is determined for each of the stack of two-dimensional slices 128. The slice SEMAC factor is determined by counting the number of phase encodings that encode for volumes within the region of interest. Initially each slice has a slice SEMAC factor equal to the maximum SEMAC factor. After step 200 the slice SEMAC factor may be reduced by the number of selected phase encodings identified for a particular slice. In step 204 the pulse sequence data is modified by dividing the stack of two-dimensional slices into multiple packages. Slices within each of the multiple packages are ordered using an outer linear profile in the perpendicular direction. The stack of two-dimensional slices are divided into the multiple packages by grouping slices which has a slice SEMAC factor within a predetermined range. In the case of for instance say two or three multiple packages the slices may be divided into a group with a larger and smaller slice SEMAC factor.

Each of the multiple packages is acquired as a series of pulse sequence repetitions. Next in step 206 the pulse sequence data is further modified by reordering the profile order of the package to remove at least some of the selected phase encodings. The package is chosen from the multiple packages. Finally in step 208 the magnetic resonance data is acquired by controlling the magnetic resonance imaging system 100 with the pulse sequence data 150. The acquisition is done with the pulse sequence data after it has been modified by the other steps.

For SEMAC, the same number of additional perpendicular or "z-encodings" is acquired for each slice. In SEMAC, typically a phase encoding in the "z" direction is performed. However the phase encoding gradient can be constructed from components of the typical x, y, and z gradients of an MRI system. References to z-encoding is understood to be also applicable with respect to an arbitrary direction that is chosen with respect to the slices of the region of interest (ROI). It is understood that references to z-encoding or encoding in the "z" direction refers to encoding that is perpendicular to the stack of slices.

In the final combination process the outermost z-encoding cannot be used because they lack a corresponding slice to be combined with. As a result, useless data is required and increases the scan time. The idea is to adapt the SEMAC factor per slice such that only z-encodings which are required for the final combination are acquired. To allow this, slices with comparable SEMAC factors have to be grouped in acquisition packages with optimized acquisition order in order to avoid cross-talk.

Figure 3:
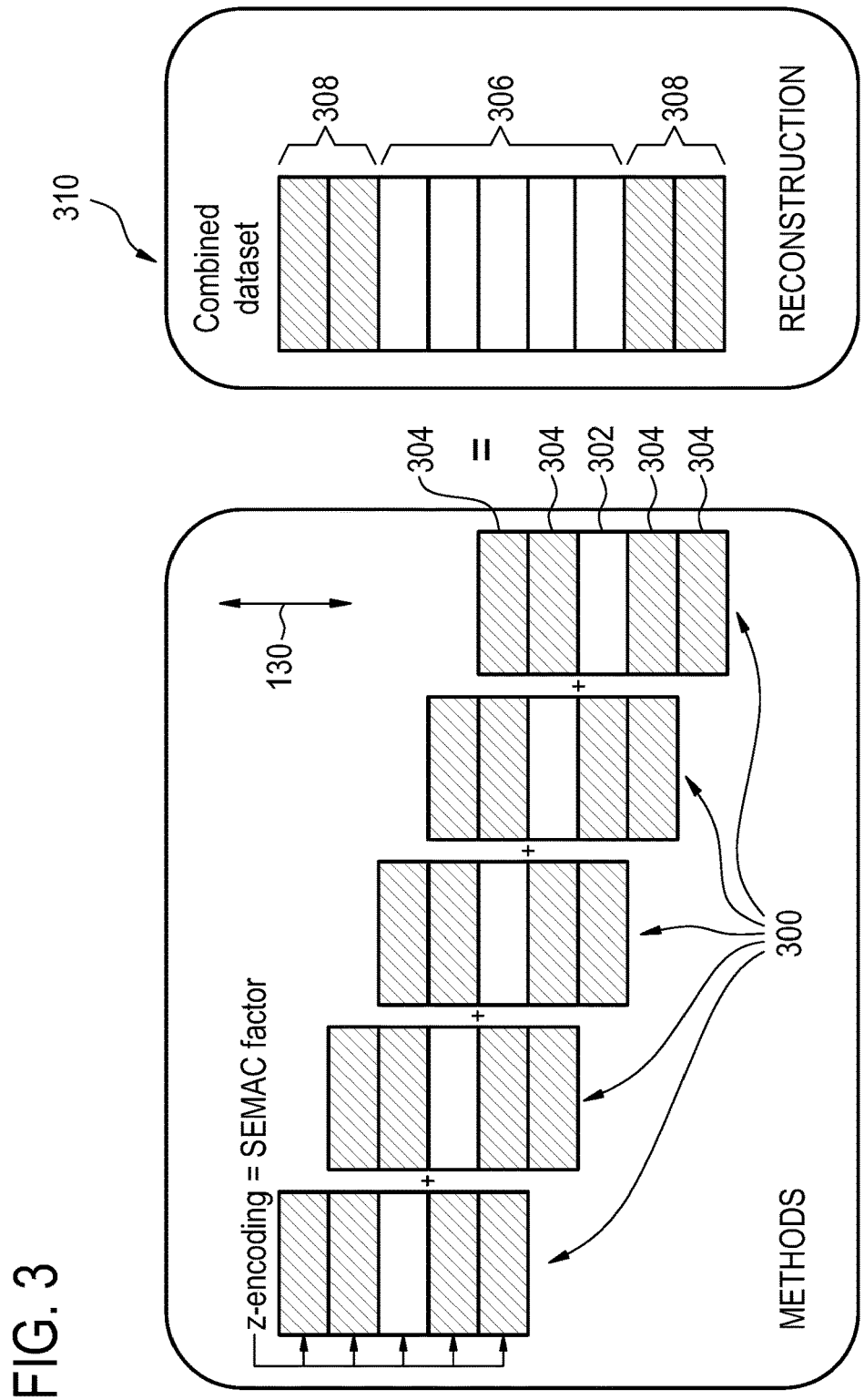
FIG. 3 illustrates a SEMAC method of magnetic resonance imaging.

FIG. 3 illustrates a normal SEMAC method. The blocks labeled 300 each represent a slice. One slice 300 has been labeled. The block in the middle 302 represents the physical location of the slice. The blocks labeled 304 are regions that are offset from the slice 302 that are phase encoded in the perpendicular direction. The blocks on the right hand side of FIG. 3 show an assembled field of view 306. The assembled field of view 306 comprises the data from the location of the slice 302 and also all the other offset phase encoded regions 304 which are in the same spatial location. It can be seen that the combined dataset 310 contains an assembled field of view 306 and also extra data 308 which is outside of the field of view 306.

SEMAC is a Multi-Slice based acquisition scheme, which applies an additional through-plane phase encoding to correct slice distortions. The resulting overlapping volumes are then combined during reconstruction into distortion-corrected images that contain information from multiple selected slices.

Slice-Encoding for Metal Artifact Correction, or SEMAC ("Slice encoding for metal artefact correction) is a known acquisition technique to reduce susceptibility artifacts due to presence of metal. SEMAC is based on a Multi-Slice TSE acquisition, and applies an additional through-plane phase encoding to correct slice distortions at the cost of increased scan duration. The resulting overlapping volumes are then combined into distortion-corrected images that contain information from multiple selected slices.

In a standard SEMAC acquisition the same SEMAC factor (number of additional z-encodings) is applied for each slice. However, for the outermost slices some z-encodings cannot be used for the final combination since they are lacking a corresponding slice to be combined with.

FIGS. 4 through 7 illustrate a method of arranging the acquisition of the SEMAC magnetic resonance data such that the extra data 308 is not acquired. This reduces the amount of time to acquire the magnetic resonance data.

Figure 4:
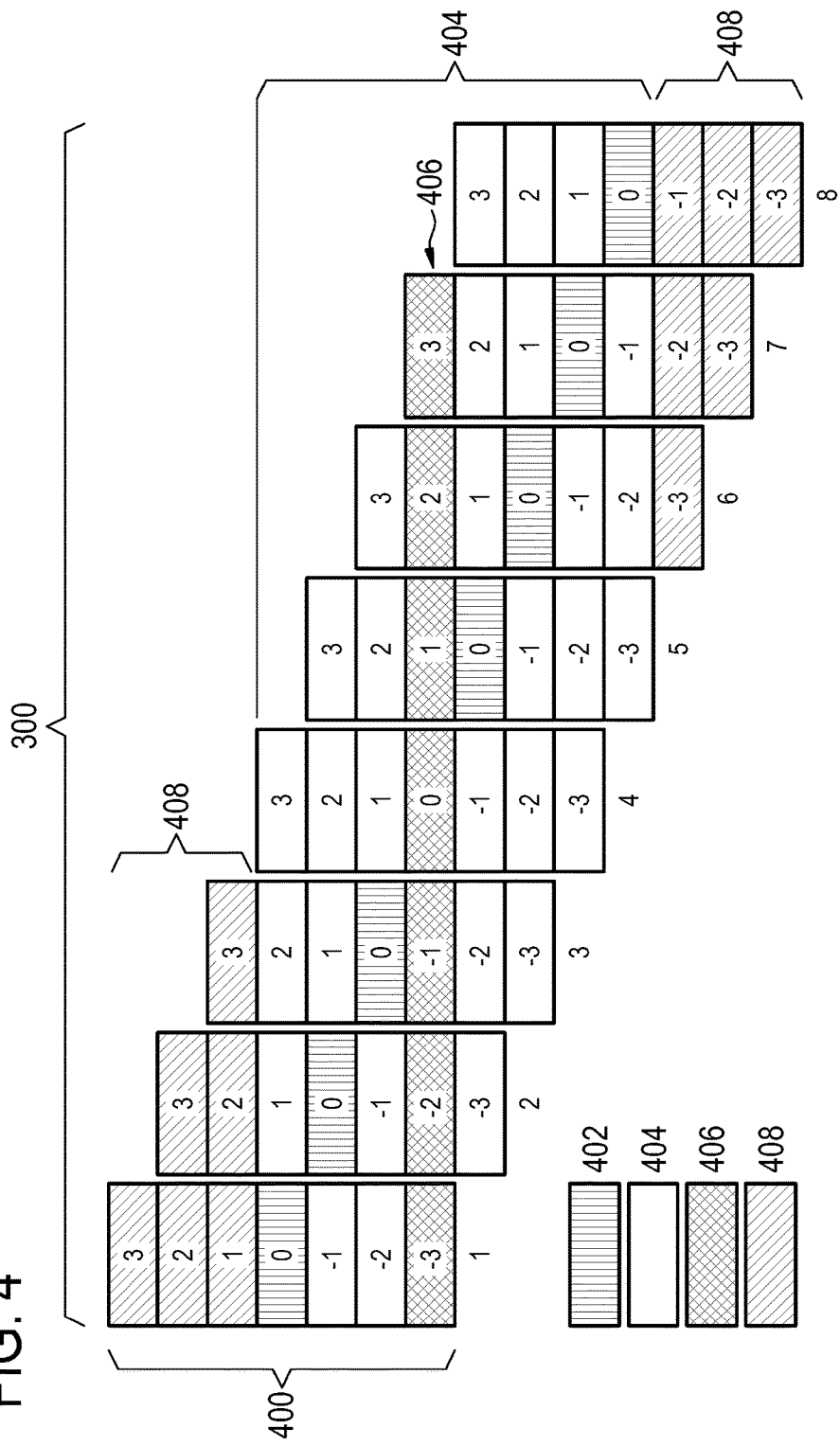
FIG. 4 illustrates a modified SEMAC method of magnetic resonance imaging.

FIG. 4 shows a SEMAC acquisition where there are eight slices. These are labeled 300. The maximum SEMAC factor in this acquisition is 7. The phase encoding for these various slices 304 are labeled 3, 2, 1, 0, −1, −2, and −3. The phase encoding labeled 0 corresponds to the physical location of the actual slice. In FIG. 4 there are blocks which are shaded. The blocks labeled 402 correspond to the physical location of the slice and are also labeled 0 within each slice 300. The blocks labeled 404 contain data within the region of interest. Blocks labeled 408 are blocks which are outside of the field of interest 408. The row of blocks labeled 406 show data which will be combined from slices 1-7 to reconstruct the data in slice 4.

FIG. 4 shows a scheme for SEMAC acquisition showing the acquired z-encodings per slice (SEMAC-factor). The signal of each excited slice (402) is combined with additional off-resonance signal (406). The z-encodings indicated by 408 are not used for the final combination since they lack a corresponding excited slice to be combined with.

Examples of a modified SEMAC method may be constructed using one or more of the following features:
1) In order to optimize scan time, at least some of the z-encodings or perpendicular encodings which are required for the final combination are not acquired.
2) In order to maintain the same pulse repetition time (TR), the location order and z order are optimized such that all locations with a lower required SEMAC factor are acquired in one package with the omitted z-encodings at the end of the acquisition where they do not affect the TR.

The implementation of a modified SEMAC protocol may include one or more of the following steps:
1) Determine the SEMAC factor per location (slice).
2) Based on the number of packages required, determine the maximum SEMAC factor per package.
3) Reorder the locations such that locations with comparable SEMAC factors are placed in the same package such that the criteria for acceptable nearness are still fulfilled within that package.
4) Modify the z profile (profile in the perpendicular direction) order.
5) Use location dependent maximum and minimum encoding numbers during reconstruction in order to reconstruct only the acquired 3D volume.

Step 1: Determine the SEMAC Factor Per Location (Slice).

Using the Example of FIG. 4, We Can Identify the Following SEMAC Factors Per Location:

| Sl 1 | Sl 2 | Sl 3 | Sl 4 | Sl 5 | Sl 6 | Sl 7 | Sl 8 |
| --- | --- | --- | --- | --- | --- | --- | --- |
| 4 | 5 | 6 | 7 | 7 | 6 | 5 | 4 |

Step 2: Determine the Maximum SEMAC Factor Per Package.

This step is sensible since the required scan time for one package (Pck) always depends on the location with the highest number of z-encodings (SEMAC factor) if we want to maintain the same TR. Assuming a 2 package acquisition, the SEMAC factors per package are as follows:

| Pck 1 | Pck 2 |
|---|---|
| 7 | 5 |

Figure 5:
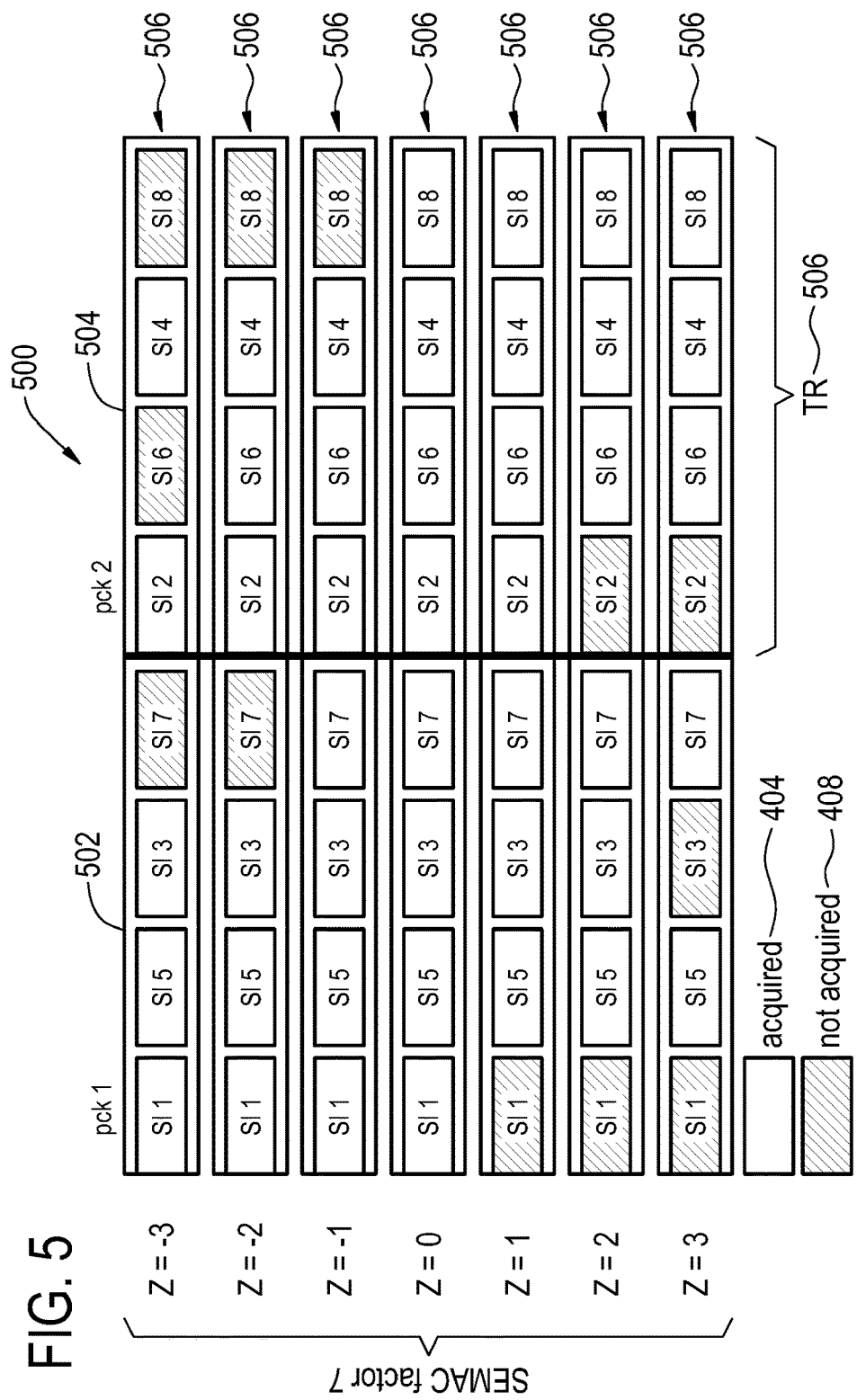
FIG. 5 further illustrates the modified SEMAC method of magnetic resonance imaging.

FIG. 5 shows the organization of the pulse sequence data using a linear profile ordering 500. The slices have been divided into package 1 (Pck 1) 502 and package 2 (Pck 2) 504. The slices have been split apart such that the slices are a maximum distance apart from each other during each pulse sequence repetition 506. In these Figs. the SEMAC factor is 7. The number of phase encodings which are outside of the field of interest can be selected 408. These are shown as dotted lines. The phase encodings within a horizontal row of each package 502 and 504 are acquired together in one pulse repetition 506. In examining the distribution of phase encodings it can be seen that the selected phase encodings are spread fairly uniformly throughout the two packages 502, 504. These particular phase encodings may be skipped; however simply skipping them does not enable one to reduce the acquisition time. To do this the slice SEMAC factor is determined for each of the slices. For example slice 1 has a slice SEMAC factor of 4. Slice 5 has a slice SEMAC factor of 7. Slice 3 has a slice SEMAC factor of 6. Slice 7 has a slice SEMAC factory of 5.

Step 3: Reorder the Locations

Figure 6:
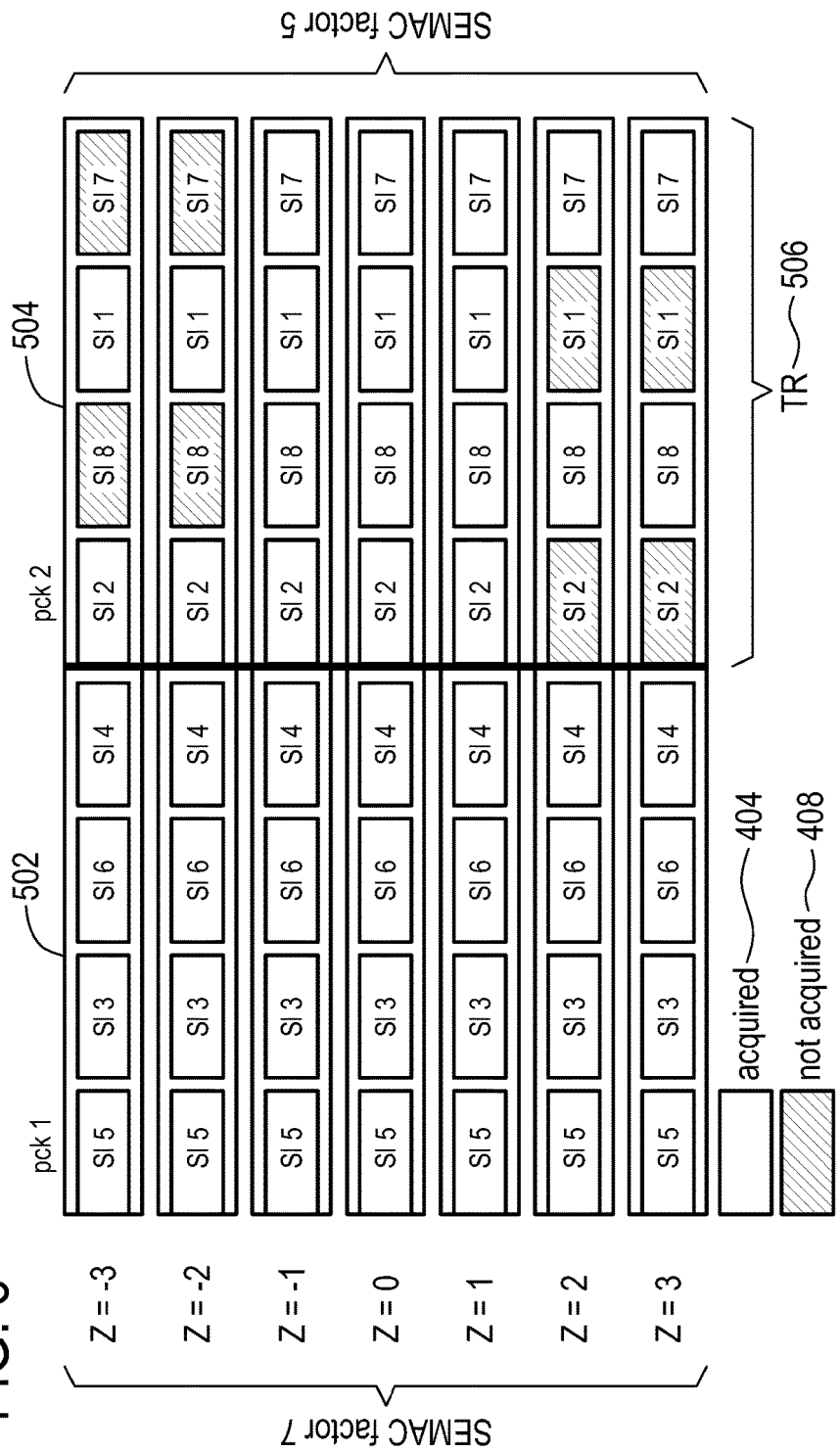
FIG. 6 further illustrates the modified SEMAC method of magnetic resonance imaging.

FIG. 5 shows the order in which the different locations and z-profiles will be acquired assuming 2 packages and a linear outer z-profile ordering. In this case, odd and even-numbered slices are separated into 2 packages and the omitted z-profiles are scattered over the acquisition period. As a result, no scan time reduction can be achieved if we want to maintain the same TR. That is why, the locations with comparable SEMAC factors have to be combined in the same package. FIG. 6 shows the same example after reordering. The central locations of the stack with the highest SEMAC factor have been placed in the first package, while the locations with lower SEMAC factors have been placed in the second package. In a second step, the location order within the package has been optimized in order to fulfill the acceptable nearness criterion for each location.

FIG. 6 shows how the choice of slices can be reordered and put into different packages 502, 504. In FIG. 6 slices 5, 3, 6 and 4 have now been assigned to package 1, 502 and slices 2, 8, 1 and 7 have been assigned to package 2, 504. Slice 3 with z phase encoding 3 and slice 6 with z phase encoding –3 were shown as not being acquired in FIG. 5. In FIG. 6 however, these two phase encoding steps are required so that a complete block of magnetic resonance data is acquired for block 502. It can be seen that the slices in package 2, 504 do not have a SEMAC factor above 5. However, if one uses the acquisition as shown in package 2 of FIG. 6 a time saving has not resulted. Each pulse repetition still needs to be performed whether the data is acquired or not.

FIG. 7 shows an example of the phase encodings being reordered. The phase encoding steps can be switched around such that the last two pulse repetitions 506, which are labeled 700, are completely filled with data 408 that is not required for reconstructing the slices. These last two pulse repetitions 506 are labeled 700. These last two pulse repetitions may be omitted. By dropping these last two pulse repetitions it can be seen that the time to acquire the magnetic resonance data for the profile order shown in FIG. 7, 702 will require less time than the profile order 500 shown in FIG. 5. In FIG. 6, the locations of phase encodings are reordered according to the SEMAC factor per location. Locations in the first package have a SEMAC factor of 7, in the second package a SEMAC factor of 5.

Step 4: Modify the z Profile Order

The acquisition order in FIG. 6 is not yet sufficient in order to save scan time since the omitted z profiles are acquired at different time points throughout the acquisition of the second package. For this, reason, the z profile order of the different locations in package 2 is adapted such that the omitted z profiles would be acquired at the end of the acquisition as shown in FIG. 7. As a result, 2 of 14 TR's do not have to be acquired which corresponds to a decrease in scan time of approximately 14%.

As mentioned above, The z-profile order has been adapted in the second package (as indicated by the z-profile number after the dash) in order to shift the omitted z-profiles to the end of the acquisition.

Step 5: Location Dependent Encoding Numbers for Reconstruction

In standard multi-chunk reconstruction, the minimum and maximum encoding numbers are the same for all locations. In this invention, the encoding numbers in z vary per location which has to be taken into account by reconstruction. Thus, the following modified encoding numbers have to be used to reconstruct the separate z-profiles:

| Slice | Sl 1 | Sl 2 | Sl 3 | Sl 4 | Sl 5 | Sl 6 | Sl 7 | Sl 8 |
|---|---|---|---|---|---|---|---|---|
| old min/max z | –3/3 | –3/3 | –3/3 | –3/3 | –3/3 | –3/3 | –3/3 | –3/3 |
| new min/max z | –3/0 | –3/1 | –3/2 | –3/3 | –3/3 | –2/3 | –1/3 | 0/3 |

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS

100 magnetic resonance system
104 magnet 106 bore of magnet
108 measurement zone or imaging zone
110 magnetic field gradient coils
112 magnetic field gradient coil power supply
114 radio-frequency coil
116 transceiver
118 subject
120 subject support
122 actuator
124 metallic object
126 region of interest
128 stack of slices
130 perpendicular direction
132 computer system
134 hardware interface
136 processor
138 user interface
140 computer storage
142 computer memory
150 pulse sequence data
152 maximum SEMAC factor
154 slice SEMAC factors
156 magnetic resonance data
158 magnetic resonance image
160 control module
162 pulse sequence modification module
164 image reconstruction module
200 identify selected phase encodings in the pulse sequence data by identifying phase encodings that encode for volumes outside of the field of view
202 determine a slice SEMAC factor for each of the stack of two dimensional slices
204 modify the pulse sequence data by dividing the stack of two dimensional slices into multiple packages
206 modify the pulse sequence data by reordering the profile order of the package to remove at least some of the selected phase encodings
208 acquire the magnetic resonance data by controlling the magnetic resonance imaging system with the pulse sequence data
300 slices
302 location of slice
304 offset phase encoded region
306 assembled field of view
308 extra data
310 combined data
400 SEMAC factor
402 actual slice
404 data combined into slices
406 data combined to form slice 4
408 data that is not used
500 linear profile ordering
502 package 1
504 package 2
700 deleted pulse repetitions
702 profile order

The invention claimed is:

1. A magnetic resonance imaging system for acquiring magnetic resonance data from an imaging zone, wherein the magnetic resonance imaging system comprises:
a memory containing machine executable instructions and pulse sequence data, wherein the pulse sequence data is descriptive of a SEMAC magnetic resonance imaging method,
wherein the pulse sequence data specifies the acquisition of a stack of two dimensional slices of a field of view, wherein the pulse sequence data further specifies phase encoding in a perpendicular direction, wherein the perpendicular direction is perpendicular to the two dimensional slices, wherein the pulse sequence data specifies a maximum SEMAC factor, wherein the maximum SEMAC factor specifies a maximum number of phase encoding steps in the perpendicular direction for each of the two dimensional slices;
a processor for controlling the magnetic resonance imaging system, wherein execution of the machine executable instructions causes the processor to:
identify selected phase encodings in the pulse sequence data that encode for volumes outside of the field of view;
determine a slice SEMAC factor for each of the stack of two dimensional slices, wherein the slice SEMAC factor is calculated by determining a number of selected phase encodings in each slice of the stack of two dimensional slices and subtracting the number from the maximum SEMAC factor;
modify the pulse sequence data by dividing the stack of two dimensional slices into multiple packages, wherein slices within each of the multiple packages are ordered using an outer linear profile in the perpendicular direction, wherein the stack of two dimensional slices are divided into the multiple packages by grouping slices which have a slice SEMAC factor within a predetermined range, wherein each of the multiple packages is acquired as a series of pulse sequence repetitions;
modify the pulse sequence data by reordering the profile order of a package to remove at least some of the selected phase encodings causing a continuous succession of the acquisition of profiles, wherein the package is chosen from the multiple packages;
acquire the magnetic resonance data by controlling the magnetic resonance imaging system with the pulse sequence data.

2. The magnetic resonance imaging system of claim 1, wherein the profile order of the package is reordered to remove the at least some of the selected phase encodings by swapping the at least some of the selected phase encodings to a chosen pulse sequence repetition, wherein the package is one of the multiple packages, wherein the chosen pulse sequence repetition is one or more of the series of pulse sequence repetitions of the package.

3. The magnetic resonance imaging system of claim 2, wherein the at least some of the selected phase encodings are removed by truncating the package by skipping the chosen pulse sequence repetition if the chosen pulse sequence is completely filled with at least a portion of the selected phase encodings.

4. The magnetic resonance imaging system of claim 1, wherein each of the stack of two dimensional slices has a slice width, wherein each phase encoding in the perpendicular direction corresponds to an offset that is equivalent to the slice width.

5. The magnetic resonance imaging system of claim 1, wherein each of the series of pulse sequence repetitions contains one measurement of the magnetic resonance data from each slice of the package.

6. The magnetic resonance imaging system of claim 1, wherein the pulse sequence data specifies the acquisition of a stack of two dimensional slices of a field of view using a view-angle-tilting spin-echo sequence.

7. The magnetic resonance imaging system of claim 1, wherein execution of the instructions causes the processor to reconstruct a magnetic resonance image from the magnetic resonance data according to the SEMAC magnetic resonance imaging method.

8. A method of operating a magnetic resonance imaging system for acquiring magnetic resonance data from an imaging zone by controlling the magnetic resonance imaging system with pulse sequence data, wherein the pulse sequence data is descriptive of a SEMAC magnetic resonance imaging method, wherein the pulse sequence data specifies the acquisition of a stack of two dimensional slices of a field of view, wherein the pulse sequence data further specifies phase encoding in a perpendicular direction, wherein the perpendicular direction is perpendicular to the two dimensional slices, wherein the pulse sequence data specifies a maximum SEMAC factor, wherein the maximum SEMAC factor specifies a maximum number of phase encoding steps in the perpendicular direction for each of the two dimensional slices, wherein the method comprises the steps of:
identify selected phase encodings in the pulse sequence data that encode for volumes outside of the field of view;
determining a slice SEMAC factor for each of the stack of two dimensional slices, wherein the slice SEMAC factor is calculated by determining a number of selected phase encodings in each slice of the stack of two dimensional slices and subtracting the number from the minimum SEMAC factor;
modifying the pulse sequence data by dividing the stack of two dimensional slices into multiple packages, wherein slices within each of the multiple packages are ordered using an outer linear profile in the perpendicular direction, wherein the stack of two dimensional slices are divided into the multiple packages by grouping slices which have a slice SEMAC factor within a predetermined range, wherein each of the multiple packages is acquired as a series of pulse sequence repetitions;
modifying the pulse sequence data by reordering the profile order of a package to remove at least some of the selected phase encodings, causing a continuous succession of the acquisition of profiles, wherein the package is chosen from the multiple packages; and
acquiring the magnetic resonance data by controlling the magnetic resonance imaging system with the pulse sequence data.

9. The method of claim 8, wherein the profile order of the package is reordered to remove the selected phase encodings by swapping the at least some of the selected phase encodings to a chosen pulse sequence repetition, wherein the package is one of the multiple packages, wherein the chosen sequence repetition is one or more of the series of pulse sequence repetitions of the package.

10. The method of claim 9, wherein the at least some of the selected phase encodings are removed by truncating the package by skipping the chosen pulse sequence repetition if the chosen pulse sequence is completely filled with at least a portion of the at least some of the selected omitted phase encodings.

11. The method of claim 8, wherein each of the stack of two dimensional slices has a slice width, wherein each phase encoding in the perpendicular direction corresponds to an offset that is equivalent to the slice width.

12. The method of claim 8, wherein each of the series of pulse sequence repetitions contains one measurement of the magnetic resonance data from each slice of the package.

13. The method of claim 8, wherein the method further comprises the step of reconstructing a magnetic resonance image from the magnetic resonance data according to the SEMAC magnetic resonance imaging method.

14. A non-transitory computer program product comprising machine executable instructions for execution by a processor controlling a magnetic resonance imaging system, wherein the magnetic resonance imaging system is configured for acquiring magnetic resonance data from an imaging zone, wherein the magnetic resonance imaging system comprises:

a memory containing pulse sequence data, wherein the pulse sequence data is descriptive of a SEMAC magnetic resonance imaging method, wherein the pulse sequence data specifies the acquisition of a stack of two dimensional slices of a field of view, wherein the pulse sequence data further specifies phase encoding in a perpendicular direction, wherein the perpendicular direction is perpendicular to the two dimensional slices, wherein the pulse sequence data specifies a maximum SEMAC factor, wherein the maximum SEMAC factor specifies a maximum number of phase encoding steps in the perpendicular direction for each of the two dimensional slices;
wherein execution of the machine executable instructions causes the processor to:
identify selected phase encodings in the pulse sequence data that encode for volumes outside of the field of view;
determine a slice SEMAC factor for each of the stack of two dimensional slices, wherein the slice SEMAC factor is calculated by determining a number of selected phase encoding in each slice of the stack of two dimensional slices and subtracting the number from the maximum SEMAC factor;
modify the pulse sequence data by dividing the stack of two dimensional slices into multiple packages, wherein slices within each of the multiple packages are ordered using an outer linear profile in the perpendicular direction, wherein the stack of two dimensional slices are divided into the multiple packages by grouping slices which have a slice SEMAC factor within a predetermined range, wherein each of the multiple packages is acquired as a series of pulse sequence repetitions;
modify the pulse sequence data by reordering the profile order of a package to remove at least some of the selected phase encodings, causing a continuous succession of the acquisition of profiles, wherein the package is chosen from the multiple packages;
acquire the magnetic resonance data by controlling the magnetic resonance imaging system with the pulse sequence data.

* * * * *